US012806743B2

(12) United States Patent
Shimizu

(10) Patent No.: US 12,806,743 B2
(45) Date of Patent: Nov. 24, 2026

(54) WORKPIECE SUCTION DEVICE

(71) Applicant: Tokyo Seimitsu Co., Ltd., Tokyo (JP)

(72) Inventor: Tasuku Shimizu, Tokyo (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 310 days.

(21) Appl. No.: 18/432,294

(22) Filed: Feb. 5, 2024

(65) Prior Publication Data

US 2024/0261941 A1 Aug. 8, 2024

(30) Foreign Application Priority Data

Feb. 6, 2023 (JP) ................................ 2023-016106

(51) Int. Cl.

*B25B 11/00* (2006.01)
*B23Q 3/08* (2006.01)
*H10P 72/78* (2026.01)

(52) U.S. Cl.

CPC ............ *B25B 11/005* (2013.01); *B23Q 3/088* (2013.01); *H10P 72/78* (2026.01)

(58) Field of Classification Search

CPC .................. B23Q 3/088; B25B 11/005; B25J 15/0616–0633; H10P 72/78
See application file for complete search history.

(56) References Cited

U.S. PATENT DOCUMENTS 5,436,693 A 7/1995 Marumo
2023/0294305 A1 9/2023 Nakamura et al.

FOREIGN PATENT DOCUMENTS

JP 6-151561 A 5/1994
JP 2009-202265 A 9/2009
JP 2021-145088 A 9/2021
KR 20120105836 A * 9/2012 ............. C23C 14/50
WO WO2022/025020 A1 2/2022

OTHER PUBLICATIONS

Japanese Office Action for counterpart Japanese Application No. 2023-016106, dated Aug. 26, 2026, with English translation.

* cited by examiner

*Primary Examiner* — Tyrone V Hall, Jr.
(74) *Attorney, Agent, or Firm* — Birch, Stewart, Kolasch & Birch, LLP

(57) ABSTRACT

A workpiece suction device may efficiently suck a warped workpiece at low cost without damaging the warped workpiece. The workpiece suction device includes: a workpiece table capable of sucking a warped workpiece; an ejector that generates negative pressure for sucking warped workpiece; a first negative pressure line communicating between the ejector and the workpiece table; a second negative pressure line which is configured separately from the first negative pressure line, and communicates with the workpiece table; a vacuum tank provided in the second negative pressure line; and a negative pressure control unit which selectively switches between a first operation and a second operation, wherein the first operation supplies negative pressure generated by the negative pressure generating unit to the workpiece table in a case where the workpiece is sucked onto the workpiece table, and the second operation supplies negative pressure of the vacuum tank to the workpiece table.

6 Claims, 8 Drawing Sheets

WORKPIECE SUCTION DEVICE

CROSS-REFERENCE TO RELATED APPLICATION

The present application claims priority under 35 U.S.C § 119(a) to Japanese Patent Application No. 2023-016106 filed on Feb. 6, 2023, which is hereby expressly incorporated by reference, in its entirety, into the present application.

BACKGROUND OF THE INVENTION

Field of the Invention

The present invention relates to a workpiece suction device (workpiece vacuum-suction device), and particularly to a workpiece suction device to be mounted on a dicing apparatus for performing dicing processing on a workpiece.

Description of the Related Art

For example, a dicing apparatus that divides a workpiece such as a wafer, on which semiconductor devices or electronic components are formed, into individual chips includes: a spindle motor that rotates a blade at high speed; a workpiece table that sucks (vacuum-sucks) and holds a workpiece; and X, Y, Z, and θ driving units that change a relative position between the spindle motor and the workpiece table. The dicing apparatus performs dicing processing (cutting processing) by cutting the workpiece with the blade, while relatively moving the blade and the workpiece by each driving unit.

Japanese Patent Application Laid-Open No. 2021-145088 discloses a workpiece suction device to be mounted on a dicing apparatus. The workpiece suction device has a porous chuck and a vacuum source. The workpiece suction device starts the vacuum source to generate a vacuum suction force between an object to be attached, which is placed onto the porous chuck, and the suction surface of the porous chuck so as to suck and hold the object onto the suction surface.

CITATION LIST

Patent Literature 1: Japanese Patent Application Laid-Open No. 2021-145088

SUMMARY OF THE INVENTION

A dicing apparatus is desired to be able to stably perform dicing processing even when the dicing apparatus processes (machines) a workpiece with large warpage (hereinafter referred to as a "warped workpiece"), such as a workpiece in which metal layers and semiconductor layers are bonded together or a workpiece such as a package substrate, for example.

Here, when the warped workpiece is placed onto a flat suction surface, an air escape path is formed between the suction surface and the warped workpiece, so it is difficult to suck the warped workpiece onto the suction surface. In order to solve the problem, for example, it is conceivable to press the warped workpiece against the suction surface or use a vacuum pump that generates a large negative pressure, so that the warped workpiece is forcibly sucked onto the suction surface.

However, in the technique of pressing the warped workpiece against the suction surface, the components mounted on the workpiece (electronic components, etc.) may be damaged. Furthermore, in the technique of using a vacuum pump, once the warped workpiece is sucked onto the suction surface, high evacuation speed by the vacuum pump is unnecessary anymore (in other words, once a negative pressure becomes stably high, the warped workpiece can be sucked and held with a small evacuation speed). However, the vacuum pump must continue to be used. This causes a problem of loss in terms of cost.

The presently disclosed invention has been made in view of such problems, and aims to provide a workpiece suction device capable of efficiently sucking a warped workpiece at low cost without damaging the warped workpiece.

In order to achieve the object of the present invention, a workpiece suction device according to the present disclose includes: a workpiece table capable of sucking a workpiece; a negative pressure generating unit configured to generate negative pressure for sucking the workpiece; a first negative pressure line configured to communicate between the negative pressure generating unit and the workpiece table; a second negative pressure line which is configured separately from the first negative pressure line, and communicates between the negative pressure generating unit and the workpiece table; a vacuum tank provided on the second negative pressure line; and a negative pressure control unit configured to selectively switch between a first operation and a second operation, wherein the first operation supplies negative pressure generated by the negative pressure generating unit to the workpiece table in a case where the workpiece is sucked onto the workpiece table, and the second operation supplies negative pressure of the vacuum tank to the workpiece table.

According to an aspect of the present disclose, preferably, the negative pressure control unit temporarily performs the second operation and then performs only the first operation in a case where the workpiece is sucked onto the workpiece table.

According to an aspect of the present disclosure, preferably, the negative pressure control unit starts the first operation before starting the second operation.

According to an aspect of the present disclosure, preferably, the workpiece suction device includes a first flow rate control valve provided closer to the workpiece table than the vacuum tank on the second negative pressure line.

According to an aspect of the present disclosure, preferably, the negative pressure control unit supplies negative pressure which is generated by the negative pressure generating unit to the vacuum tank, in a case where the second operation is stopped.

According to an aspect of the present disclosure, preferably, the workpiece suction device includes a second flow rate control valve provided closer to the negative pressure generating unit than the vacuum tank on the second negative pressure line.

The presently disclosed invention may efficiently suck a warped workpiece at low cost without damaging the warped workpiece.

DESCRIPTION OF THE PREFERRED EMBODIMENT

Hereinafter, an embodiment of a workpiece suction device according to the presently disclosed invention will be described according to the accompanying drawings.

Figure 1:
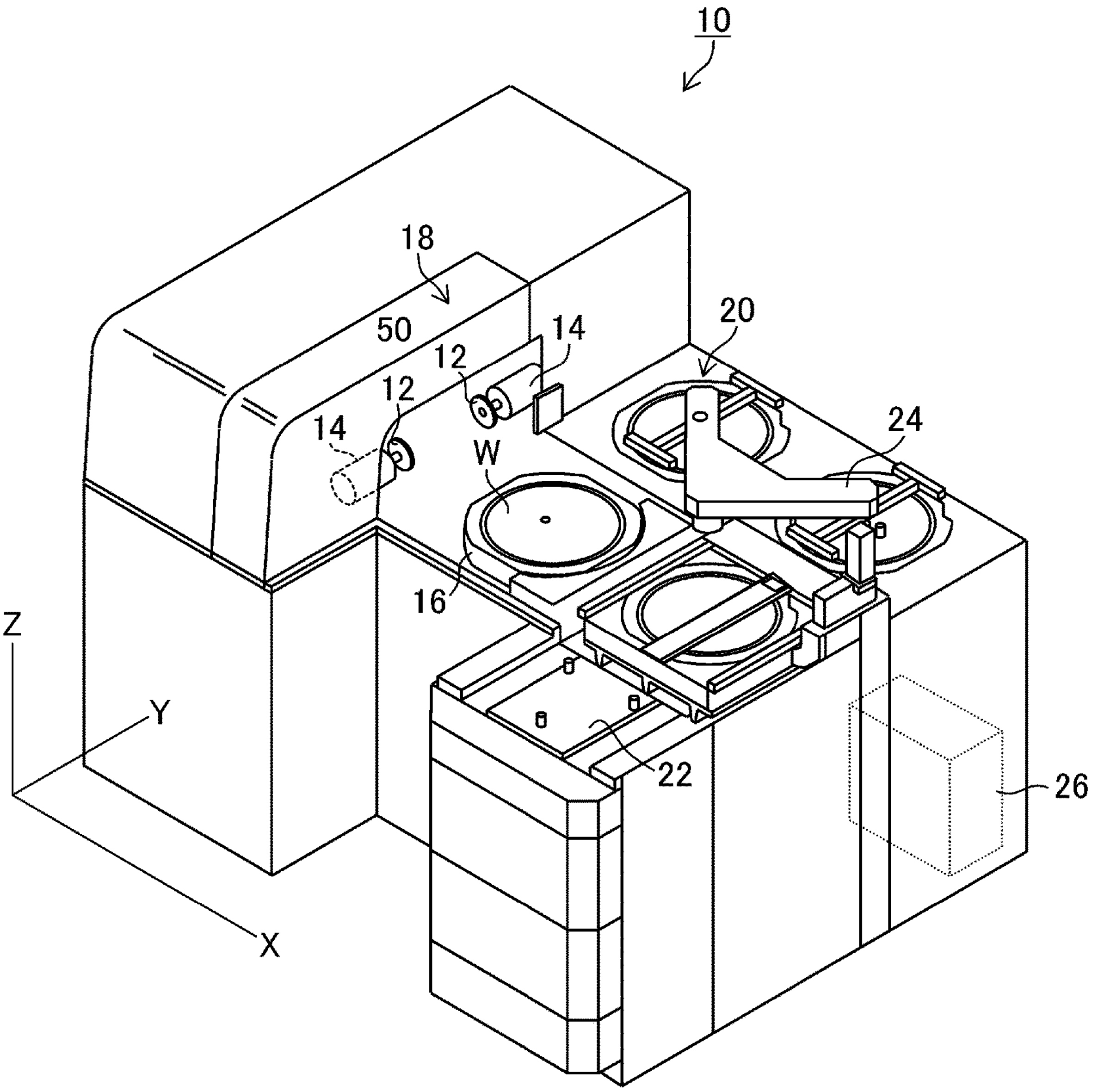
FIG. 1 is an overall perspective view of a dicing apparatus equipped with a workpiece suction device according to an embodiment.

FIG. 1 is an overall perspective view of a dicing apparatus 10 equipped with the workpiece suction device according to the embodiment. First, a configuration of the dicing apparatus 10 will be described.

As shown in FIG. 1, the dicing apparatus 10 of this example is a dicing apparatus called a twin spindle dicer in which a pair of blades 12, 12 are arranged facing each other. This dicing apparatus 10 includes a processing unit 18 having: a pair of spindles 14, 14, incorporated in high-frequency motors, each having a blade 12 fixed to an end part thereof; and a workpiece table 16 onto which a workpiece (hereinafter also referred to as a warped workpiece) W is placed, and sucked and held. The processing unit 18 performs dicing processing on the workpiece W with the blades 12 while moving the workpiece W and the blades 12 relatively.

Furthermore, in the dicing apparatus 10, a cleaning unit 20 that performs spin cleaning on the processed workpiece W, a load port 22 on which a cassette containing workpieces W is placed, and a transport device 24 that transports the workpiece W, are arranged in their respective predetermined positions. Furthermore, the dicing apparatus 10 has a built-in control unit 26 that controls the operation of each member of the dicing apparatus 10 in an integrated manner.

Figure 2:
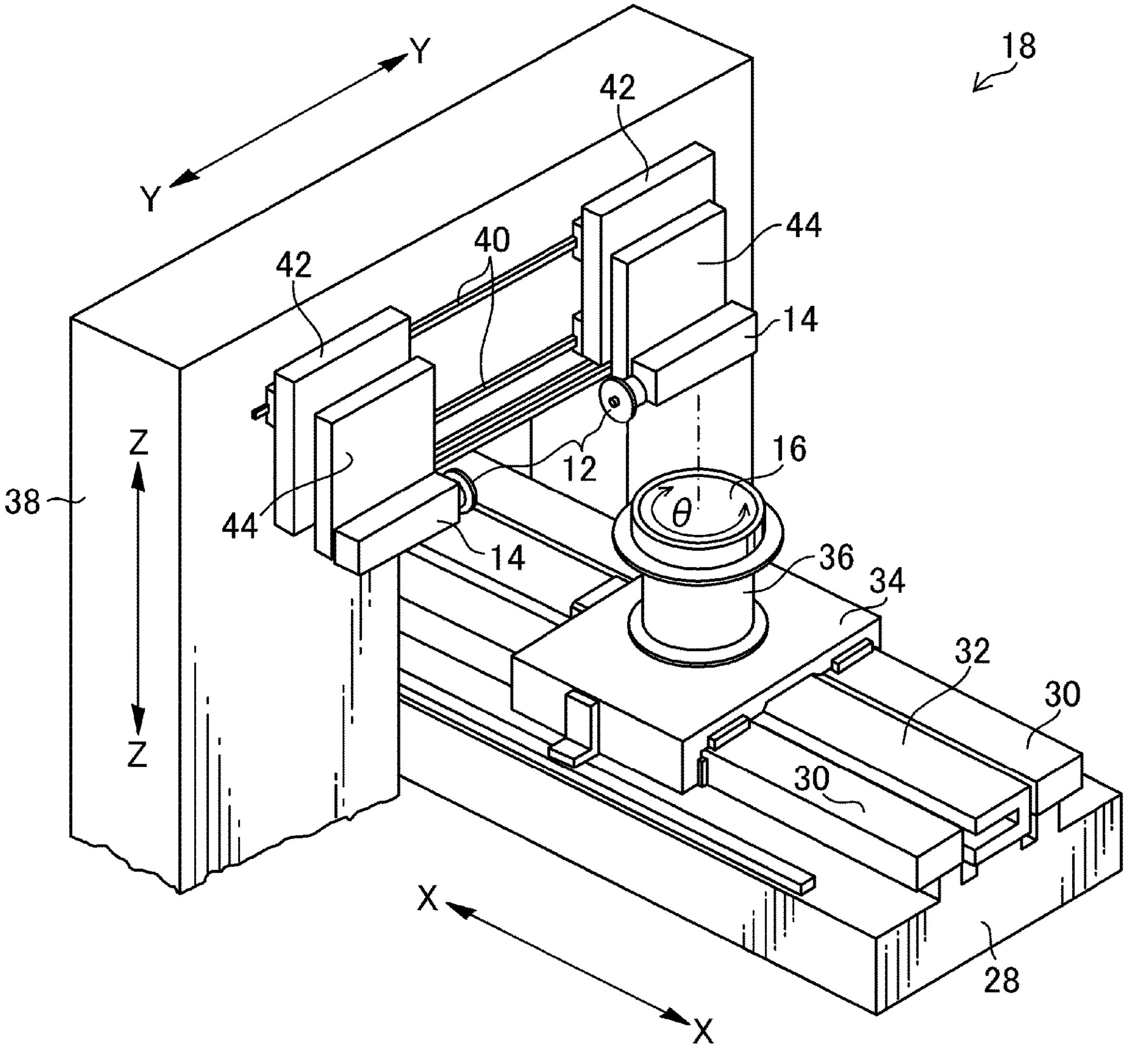
FIG. 2 is a perspective view showing a configuration of a processing unit of the dicing apparatus shown in FIG. 1.

FIG. 2 is a perspective view showing a structure of the processing unit 18. As shown in FIG. 2, the processing unit 18 includes an X table 34. The X table 34 is guided by X guides 30, 30 provided on an X base 28, and is driven by a linear motor 32 in an X direction indicated by an arrow X-X. Furthermore, a rotary table 36 that rotates in a θ direction is fixed to the upper surface of the X table 34, and the workpiece table 16 is provided on the rotary table 36. Therefore, the workpiece table 16 is moved in the X direction by the X table 34 and is rotated in the θ direction by the rotary table 36.

Furthermore, the processing unit 18 includes a Y base 38 configured in a gate shape so as to straddle the X base 28. Y tables 42, 42 are provided on the wall surface of the Y base 38. The Y tables 42, 42 are guided by Y guides 40, 40 fixed to the wall surface of the Y base 38, and are driven in a Y direction indicated by an arrow Y-Y by driving devices each including a stepping motor and a ball screw (not shown).

The Y tables 42, 42 are provided with Z tables 44, 44, respectively. The Z tables 44, 44 are guided by Z guides (not shown) provided on the Y table 42, and are driven in a Z direction indicated by an arrow Z-Z by driving devices each including a stepping motor and a ball screw (not shown). Spindles 14, 14 are fixed to the Z tables 44, 44 so as to face each other, and blades 12, 12 attached to the end parts of the spindles 14, 14 are arranged facing each other.

With the configuration of the processing unit 18, the blades 12, 12 are indexed (fed by indexing) in the Y direction and fed for incision in the Z direction, and the workpiece table 16 is fed for cutting in the X direction and rotated in the θ direction. With such operation of the processing unit 18 and the rotating blades 12, 12, grid-shaped grooves (kerf) are cut on the surface of the workpiece W.

Figure 3:
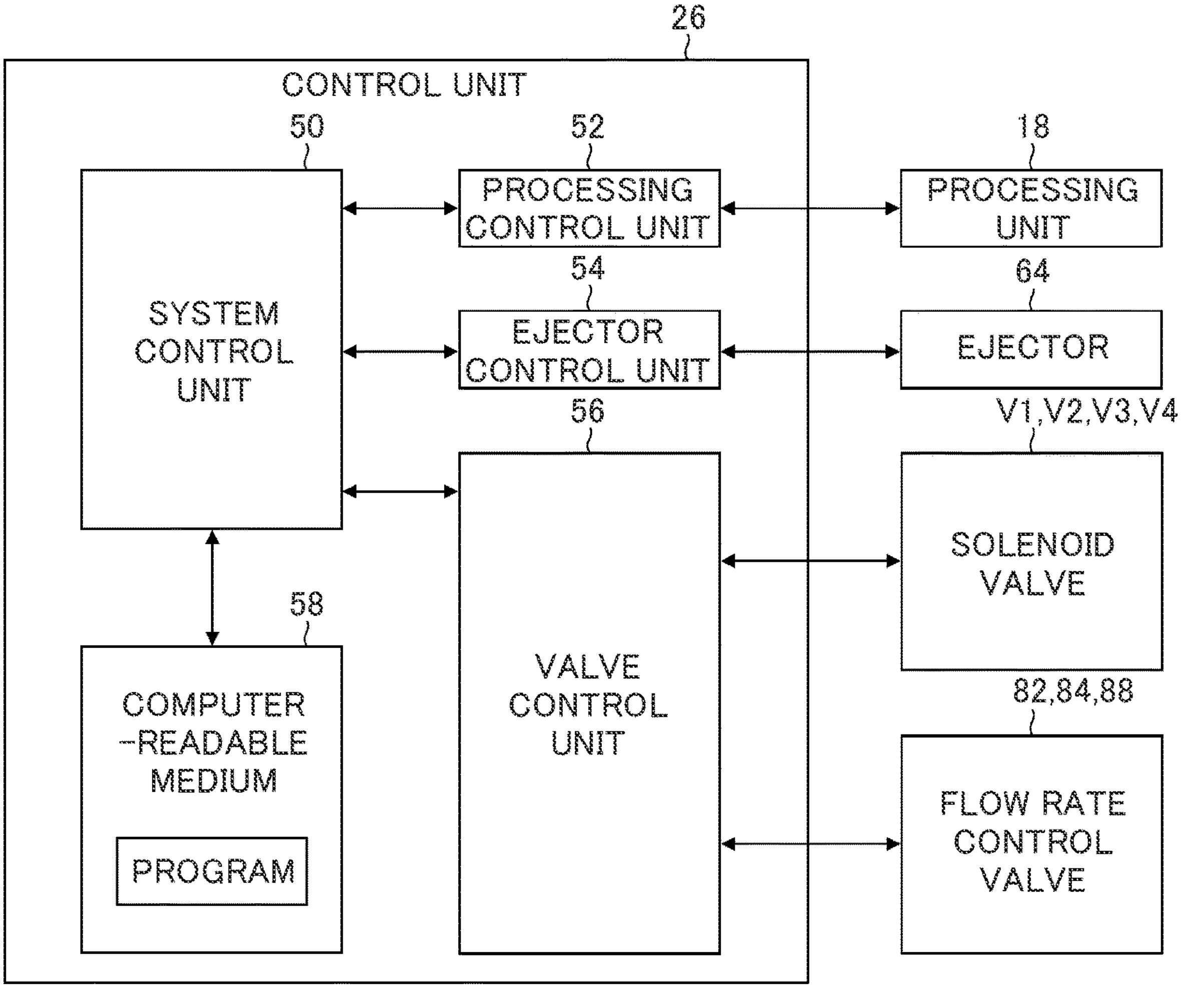
FIG. 3 is a functional block diagram showing an electrical configuration of the dicing apparatus shown in FIG. 1.

FIG. 3 is a functional block diagram showing an electrical configuration of the dicing apparatus 10 shown in FIG. 1. As shown in FIG. 3, the control unit 26 of the dicing apparatus 10 includes a system control unit 50, a processing control unit 52, an ejector control unit 54, a valve control unit 56, and a computer-readable medium 58.

The system control unit 50 integrally controls the various control units included in the control unit 26. The system control unit 50 also controls writing and reading of data, etc. to and from the computer-readable medium 58.

The processing control unit 52 controls operation of various driving members such as the cleaning unit 20 (see FIG. 1) and the transport device 24, as well as the processing unit 18 (see FIG. 2). The ejector control unit 54 controls operation of an ejector 64 of the workpiece suction device, which will be described below. The valve control unit 56 (an example of a negative pressure control unit of the present invention) controls operation of various valves (solenoid valves V1 to V4, flow rate control valves 82, 84, 88) of the workpiece suction device. The operation control of the ejector 64 by the ejector control unit 54 and the operation control of various valves by the valve control unit 56 will be described below. Note that the operation control of various driving members by the processing control unit 52 is well known, and detailed description will be omitted.

For the hardware of the control unit 26, a computer is employed. The computer functioning as the control unit 26 includes one or more processors and one or more computer-readable media 58. In the computer, a processor executes a program containing one or more instructions stored in the computer-readable medium 58 to implement the functions of each part in the control unit 26.

In the control unit 26, one processing unit or two or more processing units may be implemented using one processor, or one processing unit may be implemented using processors. The processor may include a central processing unit (CPU), which is a general-purpose processing device, or a processing device specialized for specific processing. The processors may be of the same type or may be of different types.

The computer-readable medium 58 includes memory, which is a main storage device, and storage, which is an auxiliary storage device. Furthermore, the computer-readable medium 58 may use a semiconductor memory, a hard disk device, a solid state drive device, or the like. Further, the computer-readable medium 58 may use any combination of devices.

Figure 4:
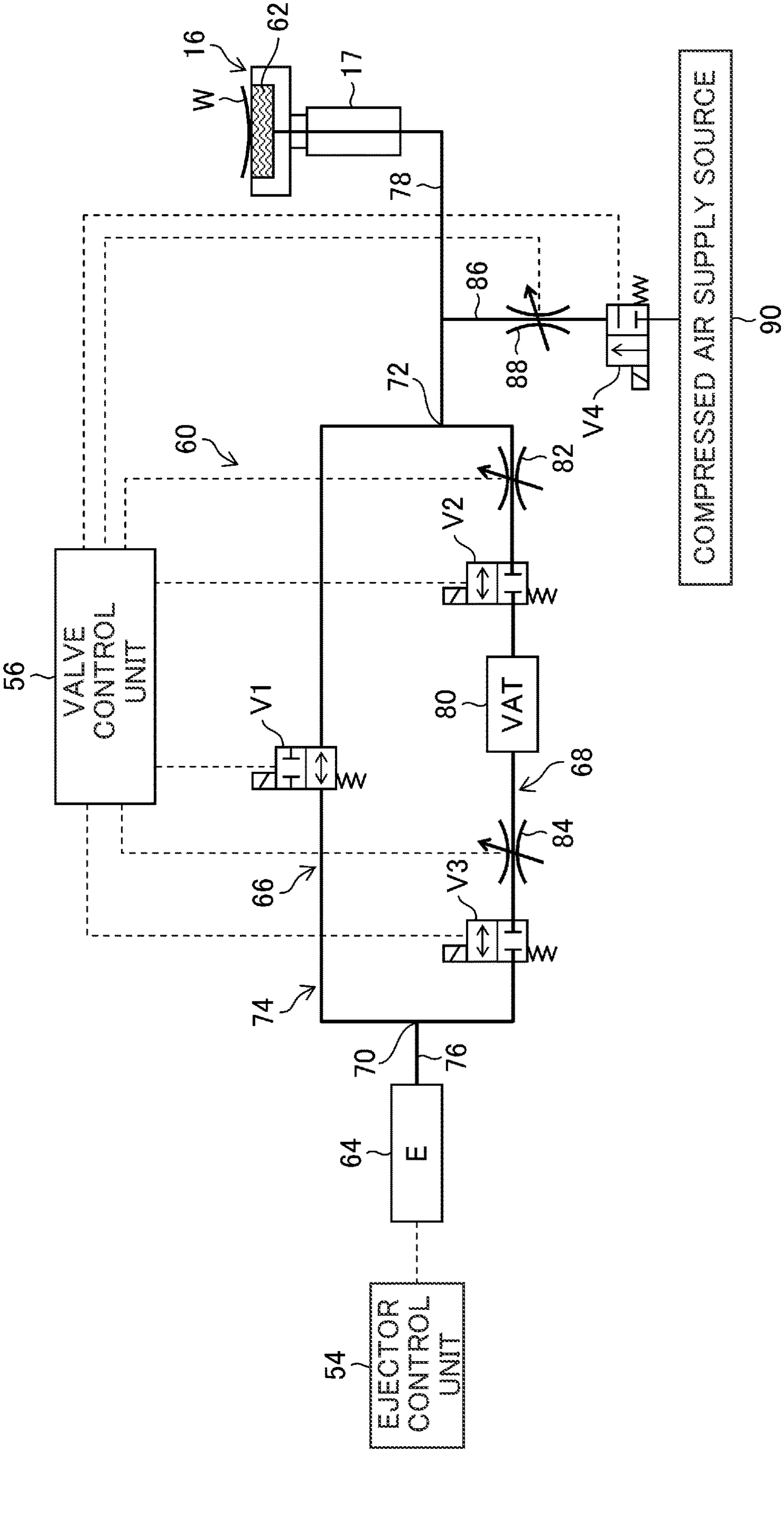
FIG. 4 is a schematic diagram showing a configuration of a workpiece suction device according to an embodiment.

Next, the workpiece suction device according to the embodiment will be described. FIG. 4 is a schematic diagram showing a configuration of the workpiece suction device 60 according to the embodiment. First, a schematic configuration of the workpiece suction device 60 will be described.

As shown in FIG. 4, the workpiece suction device 60 of the embodiment mainly includes the workpiece table 16, the ejector 64, and a negative pressure supply line 74. The workpiece table 16 includes a porous chuck 62 that sucks the workpiece W by vacuum suction force. The ejector 64 generates negative pressure to generate a vacuum suction force on porous chuck 62. Note that the ejector 64 is started and stopped according to signals given from the ejector control unit 54.

The negative pressure supply line 74 is a line that communicates between the workpiece table 16 (porous chuck 62) and the ejector 64. Note that the workpiece table 16 is an example of the workpiece table of the present invention. The ejector 64 is an example of a negative pressure generating unit of the present invention.

The negative pressure supply line 74 has two negative pressure supply lines 66 and 68 (hereinafter simply referred to as negative pressure lines 66 and 68). The two negative pressure lines 66 and 68 are lines that are branched from the negative pressure supply line 74 on the upstream side (on the ejector 64 side) at the branching part 70, respectively. The two negative pressure lines 66 and 68 join at a confluence part 72 and are connected to a negative pressure supply line 74 on the downstream side (workpiece table 16 side). In the following description, the entire negative pressure supply line including the two negative pressure lines 66 and 68 will be referred to as a "negative pressure supply line 74." Furthermore, a line on the upstream side of the branching part 70 in the negative pressure supply line 74 (a line communicating between the ejector 64 and the branching part 70) is referred to as an upstream negative pressure supply line 76, and a line on the downstream side of the confluence part 72 (a line communicating between the confluence part 72 and the workpiece table 16 (porous chuck 62)) is referred to as a downstream negative pressure supply line 78.

Of the two negative pressure lines 66 and 68, the negative pressure line 66 (hereinafter referred to as a first negative pressure line 66) is a negative pressure supply line for supplying negative pressure (small suction amount) of the ejector 64 directly to the workpiece table 16. The first negative pressure line 66 communicates with the porous chuck 62 of the workpiece table 16 via the downstream negative pressure supply line 78. On the other hand, the negative pressure line 68 (hereinafter referred to as a second negative pressure line 68) is a negative pressure supply line for supplying negative pressure (large suction amount) of the vacuum tank 80, which will be described below, to the workpiece table 16. The second negative pressure line 68 is configured separately from the first negative pressure line 66 and communicates with the porous chuck 62 of the workpiece table 16 via the downstream negative pressure supply line 78. Negative pressure supplied from the first negative pressure line 66 and the second negative pressure line 68 is each supplied to the porous chuck 62 of the workpiece table 16 via the downstream negative pressure supply line 78. Note that the first negative pressure line 66 and the second negative pressure line 68 are examples of a first negative pressure line and a second negative pressure line of the present invention, respectively.

As shown in FIG. 4, the first negative pressure line 66 is provided with a first solenoid valve V1. The first solenoid valve V1 is opened and closed according to a signal given from the valve control unit 56. When the first solenoid valve V1 is opened, the ejector 64 and the workpiece table 16 are in a communication state with each other via the first negative pressure line 66, so that the negative pressure generated by the ejector 64 may be supplied to the porous chuck 62 of the workpiece table 16 through the first negative pressure line 66. Contrarily, when the first solenoid valve V1 is closed, the ejector 64 and the workpiece table 16 are in a non-communication state with each other via the first negative pressure line 66, so that the negative pressure cannot be supplied from the ejector 64 to the porous chuck 62 of the workpiece table 16 through the first negative pressure line 66.

As shown in FIG. 4, the second negative pressure line 68 is provided with a third solenoid valve V3, a second flow rate control valve 84, a vacuum tank 80, a second solenoid valve V2, a first flow rate control valve 82, in this order from the upstream side (branching part 70 side) toward the downstream side (confluence part 72 side).

In order to be able to instantaneously supply a negative pressure greater than the negative pressure supplied through the first negative pressure line 66 to the porous chuck 62 of the workpiece table 16, the vacuum tank 80 is interposed in the middle of the second negative pressure line 68 positioned between the ejector 64 and the workpiece table 16. Note that the vacuum tank 80 is an example of a vacuum tank of the present invention.

The second solenoid valve V2 is arranged on the downstream side of the vacuum tank 80 on the second negative pressure line 68 (on the confluence part 72 side). The second solenoid valve V2 is opened and closed according to a signal given from the valve control unit 56. When the second solenoid valve V2 is opened, the vacuum tank 80 and the workpiece table 16 are in a communication state via the second negative pressure line 68 (on the downstream side of the vacuum tank 80) and the negative pressure of the vacuum tank 80 can be supplied to the porous chuck 62 of the workpiece table 16. Contrarily, when the second solenoid valve V2 is closed, the vacuum tank 80 and the workpiece table 16 are in a non-communication state via the second negative pressure line 68 (on the downstream side of the vacuum tank 80), and the negative pressure cannot be supplied from the vacuum tank 80 to the porous chuck 62 of the workpiece table 16.

The first flow rate control valve 82 is arranged on the downstream side (on the confluence part 72 side) of the vacuum tank 80 on the second negative pressure line 68. Specifically, on the downstream side of the vacuum tank 80 on the second negative pressure line 68, the first flow rate control valve 82 is arranged between the second solenoid valve V2 and the confluence part 72. The first flow rate control valve 82 is a valve for adjusting the negative pressure supplied from the vacuum tank 80 to the porous chuck 62 of the workpiece table 16. The opening degree of the first flow rate control valve 82 is adjusted according to a signal given from the valve control unit 56. When the first flow rate control valve 82 is adjusted in the opening direction, the negative pressure supplied from the vacuum tank 80 to the porous chuck 62 of the workpiece table 16 increases. Contrarily, when the first flow rate control valve 82 is adjusted in the closing direction, the negative pressure supplied from the vacuum tank 80 to the porous chuck 62 of the workpiece table 16 decreases. Note that the first flow rate control valve 82 is an example of a first flow rate control valve of the present invention.

The third solenoid valve V3 is arranged on the upstream side (on the branching part 70 side) of the vacuum tank 80 on the second negative pressure line 68. The third solenoid valve V3 is opened and closed according to a signal given from the valve control unit 56. When the third solenoid valve V3 is opened, the ejector 64 and the vacuum tank 80 are in a communication state via the second negative pressure line 68 (the upstream side of the vacuum tank 80) and the negative pressure generated by the ejector 64 can be supplied to the vacuum tank 80. Therefore, when the third solenoid valve V3 is opened while the second solenoid valve V2 is closed, the negative pressure generated by the ejector 64 is supplied to the vacuum tank 80. As a result, negative pressure is accumulated in the vacuum tank 80 so as to increase the negative pressure in the vacuum tank 80. Contrarily, when the third solenoid valve V3 is closed, the ejector 64 and the vacuum tank 80 are in a non-communication state via the second negative pressure line 68 (the upstream side of the vacuum tank 80) so as not to supply negative pressure from the ejector 64 to the vacuum tank 80.

The second flow rate control valve 84 is arranged on the upstream side (on the branching part 70 side) of the vacuum tank 80 on the second negative pressure line 68. Specifically, on the upstream side of the vacuum tank 80 on the second negative pressure line 68, the second flow rate control valve 84 is arranged between the third solenoid valve V3 and the vacuum tank 80. The second flow rate control valve 84 is a valve for adjusting the negative pressure supplied from the ejector 64 to the vacuum tank 80. The opening degree of the second flow rate control valve 84 is adjusted according to a signal given from the valve control unit 56. When the second flow rate control valve 84 is adjusted in the opening direction, the negative pressure supplied from the ejector 64 to the vacuum tank 80 increases. Contrarily, when the second flow rate control valve 84 is adjusted in the closing direction, the negative pressure supplied from the ejector 64 to the vacuum tank 80 decreases. Note that the second flow rate control valve 84 is an example of a flow rate control valve of the present invention.

As shown in FIG. 4, the downstream negative pressure supply line 78 is a line that communicates between the porous chuck 62 of the workpiece table 16 and the confluence part 72. Note that, in this example, the downstream negative pressure supply line 78 communicates with the porous chuck 62 of the workpiece table 16 via a rotary joint 17 which rotatably supports the workpiece table 16. A vacuum breaking line 86 is connected to the downstream negative pressure supply line 78 at an intermediate position between the porous chuck 62 of the workpiece table 16 and the confluence part 72.

The vacuum breaking line 86 is a line provided to release the vacuum suction of the workpiece W by the porous chuck 62 of the workpiece table 16. The vacuum breaking line 86 has a third flow rate control valve 88, a fourth solenoid valve V4, and a compressed air supply source 90. For example, when releasing the vacuum suction of the workpiece W, the fourth solenoid valve V4 is opened so as to supply compressed air from the compressed air supply source 90 to the vacuum breaking line 86. At that time, the flow rate of the compressed air supplied from the compressed air supply source 90 is adjusted by the third flow rate control valve 88. Then, the compressed air, the flow rate of which is adjusted by the third flow rate control valve 88, is supplied from the vacuum breaking line 86 to the porous chuck 62 of the workpiece table 16 through the downstream negative pressure supply line 78. Thus, the vacuum suction of the workpiece W by the porous chuck 62 of the workpiece table 16 is released. Note that the fourth solenoid valve V4 is opened and closed according to a signal given from the valve control unit 56. Furthermore, the opening degree of the third flow rate control valve 88 is adjusted according to a signal given from the valve control unit 56.

Although not shown in FIG. 4, the workpiece suction device 60 in this example has a tank pressure sensor that detects the pressure of the vacuum tank 80, and a table pressure sensor that detects the pressure of the porous chuck 62 (hereinafter also referred to as pressure of the workpiece table 16). As an example, the tank pressure sensor is attached to the vacuum tank 80, and the table pressure sensor is attached to the downstream negative pressure supply line 78. However, attaching positions of the pressure sensors are not limited to these positions, and may be any positions where the above-mentioned pressures can be detected.

Figure 5:
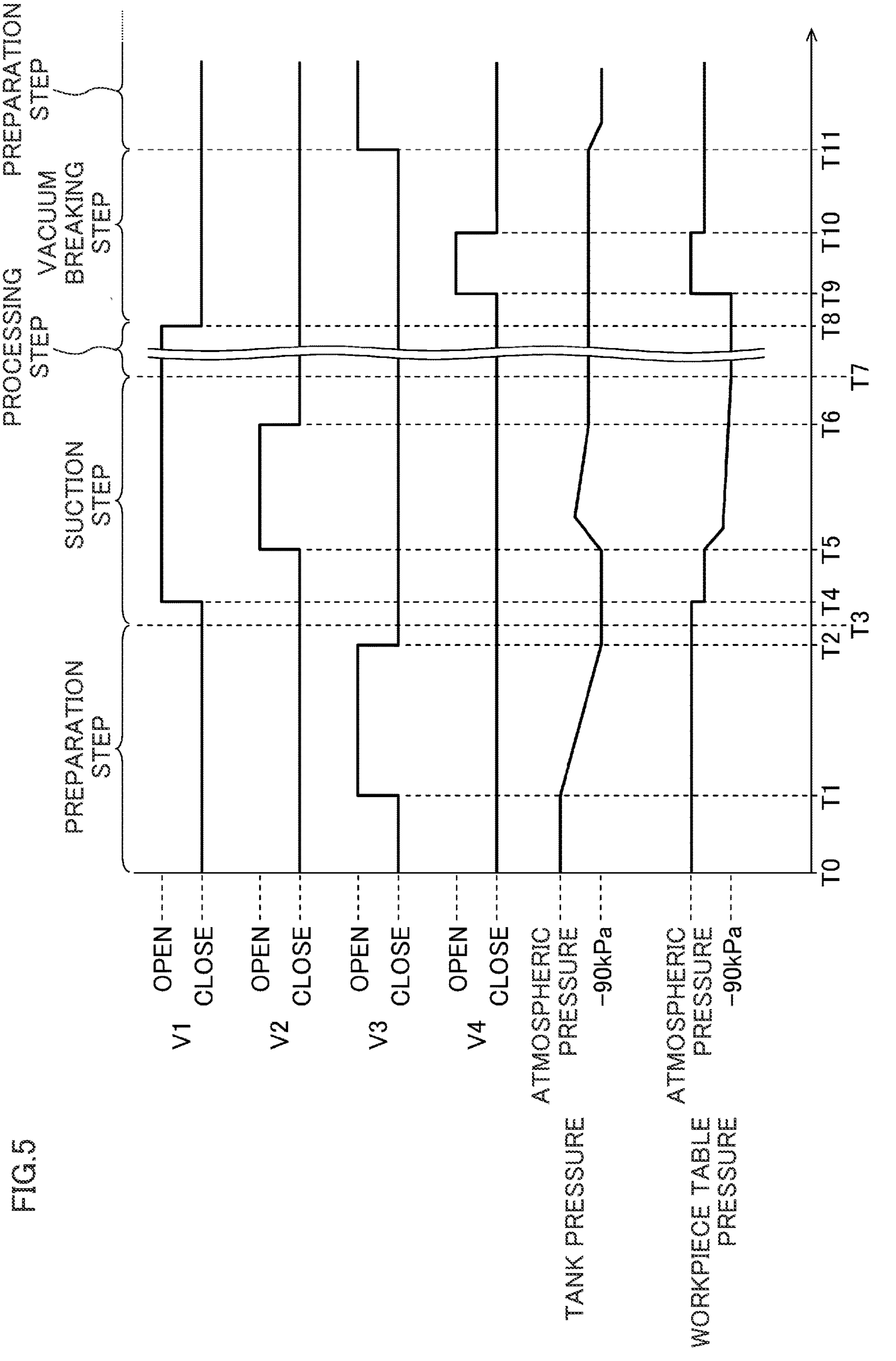
FIG. 5 is a timing chart showing an example of operation of the workpiece suction device according to the embodiment.

Next, with reference to a timing chart shown in FIG. 5, there is described an example of operation when the warped workpiece W is sucked onto the workpiece table 16 by the workpiece suction device 60 according to the embodiment. In addition, in the following description, "workpiece table 16" substantially means "porous chuck 62."

The timing chart in FIG. 5 shows the opening and closing operation (open-close) of the first solenoid valve V1, the second solenoid valve V2, the third solenoid valve V3, and the fourth solenoid valve V4. Furthermore, FIG. 5 also shows the pressures in the vacuum tank 80 and the workpiece table 16 which change in response to the opening and closing operation of each of the solenoid valves V1 to V4. The pressure in the vacuum tank 80 is detected by the tank pressure sensor, and the pressure in the workpiece table 16 is detected by the table pressure sensor.

As shown in FIG. 5, steps executed by the workpiece suction device 60 include, for example, a preparation step, a suction step, a processing step, and a vacuum breaking step. These steps are repeatedly executed for each warped workpiece W.

First, the preparation step will be described. When the start time of the preparation step is defined as T0, each of the solenoid valves V1 to V4 is closed at T0. The pressure in the vacuum tank 80 is atmospheric pressure, and the pressure in the workpiece table 16 is also atmospheric pressure. Note that the ejector 64 (see FIG. 4) is started in advance by the ejector control unit 54.

In the preparation step, the third solenoid valve V3 is opened at T1 after a lapse of a predetermined time from T0. As a result, the vacuum tank 80 communicates with the ejector 64 via the upstream part of the second negative pressure line 68 (the upstream side of the vacuum tank 80) so as to supply the negative pressure of the ejector 64 to the vacuum tank 80. In other words, the air in the vacuum tank 80 is sucked out by the ejector 64. Thus, the pressure in the vacuum tank 80 is gradually reduced from atmospheric pressure, and the third solenoid valve V3 is closed at T2 when, for example, the pressure in the vacuum tank 80 has reached about −90 kPa as shown in FIG. 5. Accordingly, the pressure in the vacuum tank 80 is set to a negative pressure (for example, about −90 kPa) with which the warped workpiece W can be sucked. Note that, in this example, the third solenoid valve V3 is closed when T2 is timed (time-controlled), but the method is not limited to this example. The third solenoid valve V3 may be closed based on the detected value (pressure) detected by the tank pressure sensor. For example, the third solenoid valve V3 may be closed when the pressure detected by the tank pressure sensor is −90 kPa.

Next, the suction step is executed. The suction step starts at time T3 when the warped workpiece W is placed onto the workpiece table 16 by the transport device 24 (see FIG. 1). The first solenoid valve V1 is opened at T4 after a lapse of a predetermined time from T3. Thus, the workpiece table 16 communicates with the ejector 64 via the first negative pressure line 66. As a result, an operation is performed to supply the negative pressure generated by the ejector 64 to the workpiece table 16 (hereinafter referred to as an ejector negative pressure supply operation), and the pressure on the workpiece table 16 is reduced from atmospheric pressure to the negative pressure. Here, at this time, because the pressure (negative pressure) detected by the table pressure sensor is, for example, about −20 kPa, the warped workpiece W is not sucked onto the workpiece table 16. Note that the ejector negative pressure supply operation is an example of a first operation of the present invention.

Then, at T5 after a lapse of a predetermined time from T4, the second solenoid valve V2 is opened. Thus, the vacuum tank 80 communicates with the workpiece table 16 via the downstream of the second negative pressure line 68 (on the downstream side of the vacuum tank 80). As a result, the vacuum tank 80 in a vacuum state undergoes vacuum break, and an operation is performed to supply the negative pressure (for example, about −90 kPa) of the vacuum tank 80 to the workpiece table 16 through the downstream of the second negative pressure line 68 (hereinafter referred to as a vacuum tank negative pressure supply operation), so that a vacuum suction force is generated in a space between the workpiece table 16 and the warped workpiece W. As a result, the warped workpiece W is flattened and sucked onto the workpiece table 16 by the vacuum suction force. Note that the vacuum tank negative pressure supply operation is an example of a second operation of the present invention.

The opening of the second solenoid valve V2 in the suction step is executed until T6 after a lapse of a specified period from T5. In other words, the second solenoid valve V2 is closed at T6. In the above specified period (period from T5 to T6), the pressure in the vacuum tank 80 detected by the tank pressure sensor increases to some extent immediately after T5, but stops increasing when the warped workpiece W is sucked onto the workpiece table 16. Then the pressure gradually decreases due to the evacuation operation of the ejector 64 which communicates with the vacuum tank 80 via the first solenoid valve V1. Furthermore, the pressure of the workpiece table 16 detected by the table pressure sensor rapidly decreases immediately after T5, but the rapid reduction stops when the warped workpiece W is sucked onto the workpiece table 16. Then the pressure gradually decreases due to the evacuation operation of the ejector 64 which communicates with the workpiece table 16 via the first solenoid valve V1. The above-mentioned specified period (period from T5 to T6) is a period necessary for the warped workpiece W to be sucked onto the workpiece table 16, and is obtained in advance through experiments, for example. Note that the first solenoid valve V1 remains open from T4 even after T6, and the ejector negative pressure supply operation is continuously performed.

Next, a processing step (cutting step) is executed. The processing step starts at a time T7 that indicates that suction of the warped workpiece W has been completed. The first solenoid valve V1 remains open from T4 in the suction process, through the entire period of the processing step. The second solenoid valve V2 remains closed from T6 in the suction step, and the third solenoid valve V3 remains closed from T2 in the preparation step. Thereby, only the negative pressure generated by the ejector 64 is supplied to the workpiece table 16 through the entire period of the processing step. In other words, in the processing step, the vacuum tank negative pressure supply operation is not performed, and only the ejector negative pressure supply operation is performed. Note that, in this example, the completion of suction of the warped workpiece W is determined when T7 is timed (time-controlled), but the method is not limited to this. The completion of suction may be determined based on a value (pressure) detected by the table pressure sensor. For example, it may be determined that the suction is completed when the pressure detected by the table pressure sensor maintains −90 kPa for a predetermined period.

In this way, without supplying the negative pressure of the vacuum tank 80 to the workpiece table 16, only the negative pressure of the ejector 64 is supplied to the workpiece table 16 through the entire period of the processing step, so that the pressure of the workpiece table 16 is maintained at a negative pressure (for example, about −90 kPa) at which the warped workpiece W can be sucked and held onto the workpiece table 16. Therefore, the warped workpiece W undergoes cutting processing while being sucked and held onto the workpiece table 16 only by the negative pressure of the ejector 64.

Next, a vacuum breaking step is executed. The vacuum breaking step starts at a time T8 when the first solenoid valve V1 is closed. The fourth solenoid valve V4 (see FIG. 4) is opened at T9 after a lapse of a predetermined time from T8. Then, compressed air from the compressed air supply source 90 is supplied to the vacuum breaking line 86, so that the compressed air, whose flow rate has been adjusted by the third flow rate control valve 88, is supplied to the workpiece table 16 via the downstream negative pressure supply line 78. As a result, the vacuum state of the workpiece table 16 is broken, and the pressure of the workpiece table 16 becomes equal to or higher than atmospheric pressure. Thus, the vacuum suction of the warped workpiece W by the workpiece table 16 is released. After that, the warped workpiece W is unloaded.

Thereafter, at T10, the fourth solenoid valve V4 is closed to return the pressure of the workpiece table 16 to atmospheric pressure, and then the warped workpiece W is unloaded from the workpiece table 16 by the transport device 24 (FIG. 1). The above is the operation of the workpiece suction device 60 for one warped workpiece W. After the operation for one warped workpiece W, the same processing is repeated for the second and subsequent warped workpieces W.

As described above, in a case where the warped workpiece W is sucked onto the workpiece table 16, the workpiece suction device 60 according to the embodiment may selectively switch between the ejector negative pressure supply operation (first operation) and the vacuum tank negative pressure supply operation (second operation). Therefore, after temporarily supplying the negative pressure (large suction amount) of the vacuum tank 80 by the vacuum tank negative pressure supply operation, it is possible to supply only the negative pressure (small suction amount) of the ejector 64 by the ejector negative pressure supply operation. This allows efficiently sucking a warped workpiece at low cost without damaging the warped workpiece W.

Furthermore, the workpiece suction device 60 according to the embodiment may start the ejector negative pressure supply operation, before the vacuum tank negative pressure supply operation is started. Therefore, the negative pressure of the ejector 64 may be introduced in advance to the workpiece table 16 (porous chuck 62) before the negative pressure of the vacuum tank 80 is supplied to the workpiece table 16. This allows the pressure of the workpiece table 16 (porous chuck 62) to be quickly reduced to the desired negative pressure state when the supply of negative pressure from the vacuum tank 80 is started. Thus, it is possible to shorten time required for the suction step.

Here, in the workpiece suction device 60 according to the embodiment, the ejector negative pressure supply operation starts before the vacuum tank negative pressure supply operation starts, but the timing is not limited to this embodiment. The ejector negative pressure supply operation just needs to start at least before the vacuum tank negative pressure supply operation ends. For example, the ejector negative pressure supply operation may be started while the vacuum tank negative pressure supply operation is in operation. In this way, the ejector negative pressure supply operation starts at least before the vacuum tank negative pressure supply operation ends. Thereby, the negative pressure of the ejector 64 is still supplied even after the warped workpiece W is sucked using the negative pressure of the vacuum tank 80. Therefore, switching from the negative pressure of the vacuum tank 80 to the negative pressure of the ejector 64 is instantaneously performed without any time lag. This allows stably sucking and holding the warped workpiece W using only the negative pressure of the ejector 64.

Furthermore, the workpiece suction device 60 according to the embodiment has a configuration in which the first flow rate control valve 82 is provided on the downstream side (on the confluence part 72 side) of the vacuum tank 80 on the second negative pressure line 68. Therefore, the first flow rate control valve 82 may suppress (reduce) the impact caused when the vacuum state of the vacuum tank 80 is broken. Thereby, it is possible to suppress (prevent) damage to the warped workpiece W due to the impact of vacuum break.

Furthermore, in the workpiece suction device 60 according to the embodiment, the negative pressure supply line 74 which communicates between the ejector 64 and the workpiece table 16, includes the first negative pressure line 66 and the second negative pressure line 68. The first negative pressure line 66 is the negative pressure supply line for directly supplying the negative pressure of the ejector 64 (small suction amount) to the workpiece table 16. The second negative pressure line 68, which is provided with the vacuum tank 80, is the negative pressure supply line for supplying the negative pressure of the vacuum tank 80 (large suction amount) to the workpiece table 16. Therefore, using a single ejector 64, it is possible to generate a high evacuation speed for flattening and sucking the warped workpiece W, as well as a small evacuation speed for maintaining suction of the warped workpiece W which has been flattened. Thus, it is possible to reduce the initial cost and running cost of the workpiece suction device 60.

Furthermore, the workpiece suction device 60 according to the embodiment has configuration in which the second flow rate control valve 84 is provided on the upstream side (on the side of the branching part 70) of the vacuum tank 80 on the second negative pressure line 68. Therefore, the amount of air in the vacuum tank 80 sucked by the ejector 64 may be restricted by the second flow rate control valve 84. Because this configuration enables the ejector 64 to stably suck the air in the vacuum tank 80, the pressure of the vacuum tank 80 may be reduced to a desired negative pressure state.

Hereinafter, modifications of the workpiece suction device according to the present embodiment will be described. Note that, in the modifications described below, the same reference numerals and characters denote members identical and similar to the workpiece suction device 60 according to the embodiment shown in FIG. 4. Furthermore, in the modifications described below, the illustration of the vacuum breaking line 86 (see FIG. 4) is omitted.

Figure 6:
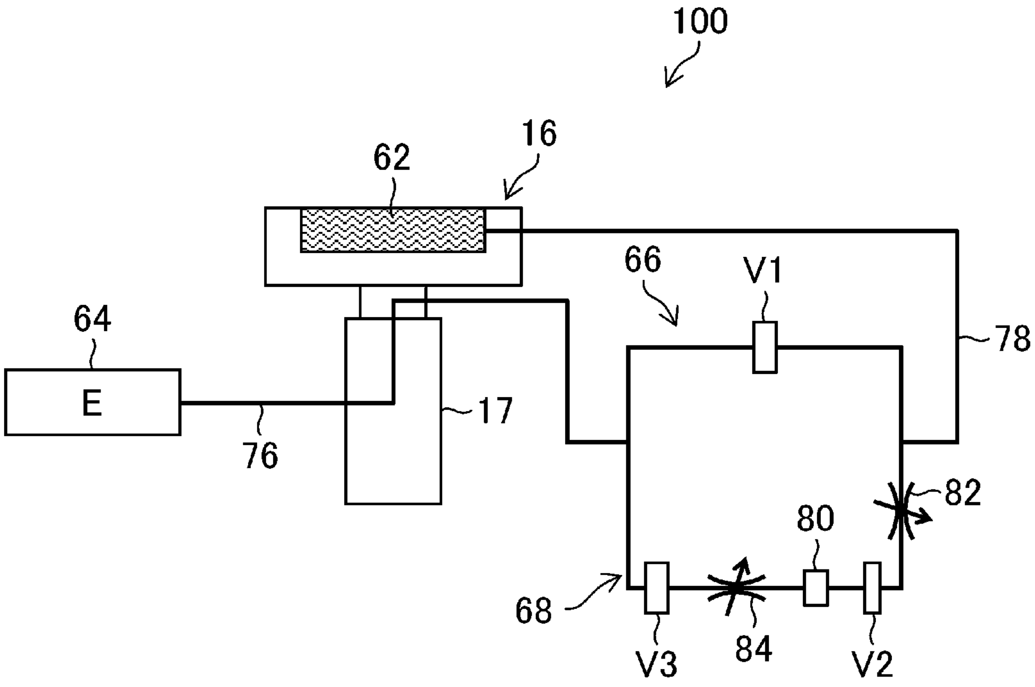
FIG. 6 is a schematic diagram showing a configuration of a first modification of the workpiece suction device.

FIG. 6 is a schematic diagram showing a configuration of a workpiece suction device according to a first modification. The workpiece suction device 100 according to the first modification shown in FIG. 6 has a configuration in which: an upstream negative pressure supply line 76 which is for small evacuation and is connected to the ejector 64 with a small piping diameter, is disposed through a rotary joint 17 which limits the evacuation speed; and a downstream negative pressure supply line 78 which is for large evacuation and is connected to the vacuum tank 80 with a large piping diameter, communicates with the porous chuck 62 without passing through the rotary joint 17.

According to the workpiece suction device 100 shown in FIG. 6, the warped workpiece W may be sucked at a high evacuation speed of the vacuum tank 80 without being restricted by the rotary joint 17 which limits the evacuation speed.

Figure 7:
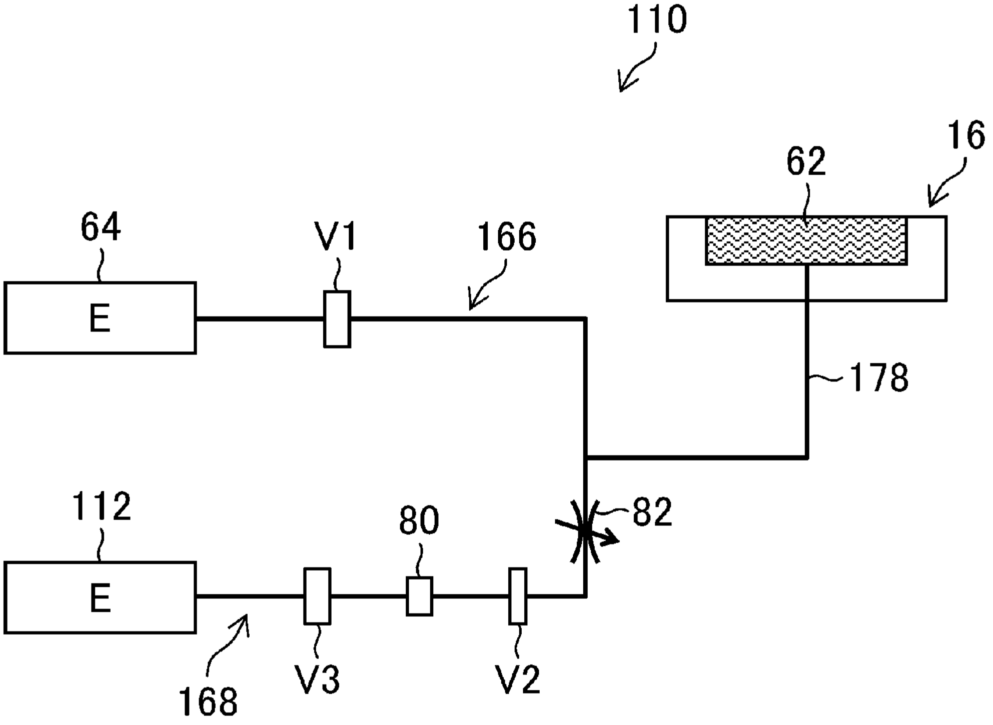
FIG. 7 is a schematic diagram showing a configuration of a second modification of the workpiece suction device.

FIG. 7 is a schematic diagram showing a configuration a workpiece suction device according to a second modification. The workpiece suction device 110 according to the second modification shown in FIG. 7 has a configuration in which: an ejector 112 is added in addition to the ejector 64; and the negative pressure generated by the ejector 112 is directly supplied to the vacuum tank 80. Note that the ejector 64 and the ejector 112 are examples of a negative pressure generating unit of the present invention.

The workpiece suction device 110 shown in FIG. 7 has a first negative pressure line 166 and a second negative pressure line 168. The first negative pressure line 166 and the second negative pressure line 168 are examples of a first negative pressure line and a second negative pressure line of the present invention, respectively.

In the workpiece suction device 110 shown in FIG. 7, one end of the first negative pressure line 166 is connected to the ejector 64, and one end of the second negative pressure line 168 is connected to the ejector 112. The other ends of the first negative pressure line 166 and the second negative pressure line 168 join together, and are connected to one end of a downstream negative pressure supply line 178. The other end of the downstream negative pressure supply line 178 is connected to the porous chuck 62 of the workpiece table 16. In other words, the ejector 64 and the workpiece table 16 (porous chuck 62) communicate with each other via the first negative pressure line 166, and the ejector 112 and the workpiece table 16 (porous chuck 62) communicate with each other via the second negative pressure line 168.

The first negative pressure line 166 is provided with the first solenoid valve V1, similarly to the first negative pressure line 66 in the above embodiment. In contrast, the second negative pressure line 168 is provided with the third solenoid valve V3, the vacuum tank 80, the second solenoid valve V2, and the first flow rate control valve 82, in order from the upstream side (ejector 112 side) to the downstream side (workpiece table 16 side).

The workpiece suction device 110 shown in FIG. 7 is provided with the dedicated ejector 112 for supplying negative pressure to the vacuum tank 80 separately from the ejector 64. Therefore, when the suction of the warped workpiece W is completed by the negative pressure of the vacuum tank 80, the second solenoid valve V2 is closed and the third solenoid valve V3 is opened so that negative pressure can be supplied to the vacuum tank 80 from the ejector 112. This eliminates the need for a preparation step to be performed after the warped workpiece W is unloaded.

Figure 8:
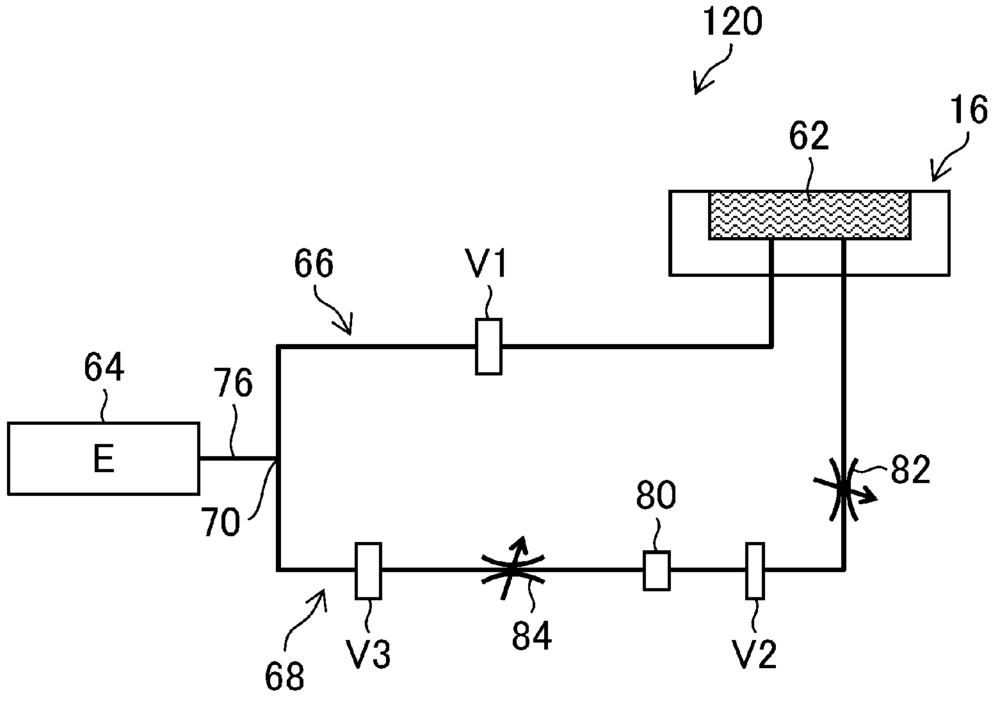
FIG. 8 is a schematic diagram showing a configuration of a third modification of the workpiece suction device.

FIG. 8 is a schematic diagram showing a configuration of a workpiece suction device according to a third modification. The workpiece suction device 120 according to the third modification shown in FIG. 8 has a configuration in which the first negative pressure line 66 and the second negative pressure line 68 do not join together, and directly communicate with the porous chuck 62. Note that, also in the workpiece suction device 110 according to the second modification example shown in FIG. 7, the first negative pressure line 166 and the second negative pressure line 168 may directly communicate with the porous chuck 62 without joining, similarly to the workpiece suction device 120 according to the third modification.

In the embodiment and the first to third modifications described above, examples have been described in which an ejector is applied as a negative pressure source configuring the negative pressure generating unit of the present invention, but the negative pressure source is not limited to this. The negative pressure source may be a mechanical or electric negative pressure pump, for example.

Furthermore, in the above embodiment and the first to third modifications, examples have been described in which the workpiece suction device of the present invention is applied to the dicing apparatus 10. However, the workpiece suction device of the present invention can also be applied to, for example, a processing device (machining device) that cuts or grinds a workpiece, a shape measuring device (profile measuring device) that measures the shape of a workpiece, and so on.

Although an example of the workpiece suction device according to the present invention has been described above, the technique of the present invention is not limited to the embodiment, and improvements or modifications may be made without departing from the gist of the present invention.

REFERENCE SIGNS LIST

10 . . . dicing apparatus, 12 . . . blade, 14 . . . spindle, 16 . . . workpiece table, 17 . . . rotary joint, 18 . . . processing unit, 20 . . . cleaning unit, 22 . . . load port, 24 . . . transport device, 26 . . . control unit, 28. . . . X base, 30. . . . X guide, 32 . . . linear motor, 34. . . . X table, 36 . . . rotary table, 38. . . . Y base, 40. . . . Y guide, 42. . . . Y table, 44. . . . Z table, 50 . . . system control unit, 52 . . . processing control unit, 54 . . . ejector control unit, 56 . . . valve control unit, 58 . . . computer-readable medium, 60 . . . workpiece suction device, 62 . . . porous chuck, 64 . . . ejector, 66 . . . first negative pressure line, 68 . . . second negative pressure line, 70 . . . branching part, 72 . . . confluence part, 74 . . . negative pressure supply line, 76 . . . upstream negative pressure supply line, 78 . . . downstream negative pressure supply line, 80 . . . vacuum tank, 82 . . . flow rate control valve, 84 . . . flow rate control valve, 86 . . . vacuum breaking line, 88 . . . flow rate control valve, 90 . . . compressed air supply source, 100 . . . workpiece suction device, 110 . . . workpiece suction device, 112 . . . ejector, 120 . . . workpiece suction device, 166 . . . first negative pressure line, 168 . . . second negative pressure line, 178 . . . downstream negative pressure supply line, V1 . . . first solenoid valve, V2 . . . second solenoid valve, V3 . . . third solenoid valve, V4 . . . fourth solenoid valve

What is claimed is:

1. A workpiece suction device, comprising:

a workpiece table capable of sucking a workpiece;

a negative pressure generating unit configured to generate negative pressure for sucking the workpiece;

a first negative pressure line configured to communicate between the negative pressure generating unit and the workpiece table;

a second negative pressure line which is configured separately from the first negative pressure line, and communicates between the negative pressure generating unit and the workpiece table;

a vacuum tank provided on the second negative pressure line only; and a negative pressure control unit configured to selectively switch between a first phase in which only a first operation is executed and a second phase in which the first operation and a second operation are executed in parallel, wherein the first operation supplies negative pressure generated by the negative pressure generating unit not via the vacuum tank but via the first negative pressure line to the workpiece table, and the second operation supplies negative pressure of the vacuum tank via the second negative pressure line to the workpiece table, in a case where the workpiece is sucked onto the workpiece table.

2. The workpiece suction device according to claim 1, wherein the negative pressure control unit temporarily performs the second operation and then performs only the first operation, in a case where the workpiece is sucked onto the workpiece table.

3. The workpiece suction device according to claim 1, wherein the negative pressure control unit starts the first operation before starting the second operation.

4. The workpiece suction device according to claim 1, further comprising a first flow rate control valve provided closer to the workpiece table than the vacuum tank, on the second negative pressure line.

5. The workpiece suction device according to claim 1, wherein the negative pressure control unit supplies negative pressure which is generated by the negative pressure generating unit to the vacuum tank, in a case where the second operation is stopped.

6. The workpiece suction device according to claim 5, further comprising a second flow rate control valve provided closer to the negative pressure generating unit than the vacuum tank on the second negative pressure line.

* * * * *